United States Patent
Whang et al.

(10) Patent No.: US 8,847,300 B2
(45) Date of Patent: Sep. 30, 2014

(54) SEMICONDUCTOR DEVICE AND METHOD FOR FABRICATING THE SAME

(75) Inventors: Sung-Jin Whang, Gyeonggi-do (KR);
Moon-Sig Joo, Gyeonggi-do (KR);
Kwon Hong, Gyeonggi-do (KR);
Jung-Yeon Lim, Gyeonggi-do (KR);
Won-Kyu Kim, Gyeonggi-do (KR);
Bo-Min Seo, Gyeonggi-do (KR);
Kyoung-Eun Chang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 640 days.

(21) Appl. No.: 12/640,491

(22) Filed: Dec. 17, 2009

(65) Prior Publication Data

US 2010/0283096 A1    Nov. 11, 2010

(30) Foreign Application Priority Data

May 8, 2009  (KR) .................. 10-2009-0040395
Jun. 30, 2009 (KR) .................. 10-2009-0059092

(51) Int. Cl.
*H01L 29/76* (2006.01)
*H01L 29/788* (2006.01)
*H01L 27/108* (2006.01)
*H01L 29/423* (2006.01)
*H01L 21/28* (2006.01)
*H01L 23/00* (2006.01)
*H01L 21/321* (2006.01)
*H01L 29/41* (2006.01)

(52) U.S. Cl.
CPC ... *H01L 29/7881* (2013.01); *H01L 2924/01022* (2013.01); *H01L 2924/01033* (2013.01); *H01L 2924/01027* (2013.01); *H01L 27/10873* (2013.01); *H01L 2924/04941* (2013.01); *H01L 2924/01014* (2013.01); *H01L 29/42324* (2013.01); *H01L 2224/0401* (2013.01); *H01L 21/28273* (2013.01); *H01L 2924/0105* (2013.01); *H01L 24/02* (2013.01); *H01L 2924/01006* (2013.01); *H01L 2924/01073* (2013.01); *H01L 2924/01005* (2013.01); *H01L 21/321* (2013.01); *H01L 29/413* (2013.01); *H01L 21/28282* (2013.01)
USPC .................. 257/314; 438/288; 257/E21.209; 257/E29.157; 257/E21.21

(58) Field of Classification Search
CPC .................................. H01L 21/28282
USPC ........ 257/288, 314, 364, 369, E21.2, E21.21, 257/E21.209, E29.157, E23.16, E23.163; 438/287, 288, 643, 685
See application file for complete search history.

(56) References Cited

U.S. PATENT DOCUMENTS

| | | | |
|---|---|---|---|
| 5,923,999 A * | 7/1999 | Balasubramanyam et al. | 438/592 |
| 6,689,658 B2 * | 2/2004 | Wu | 438/257 |
| 8,008,178 B2 * | 8/2011 | Lim et al. | 438/592 |
| 2006/0292784 A1 * | 12/2006 | Sohn et al. | 438/201 |

FOREIGN PATENT DOCUMENTS

| | | |
|---|---|---|
| JP | 11120780 | 4/1999 |
| KR | 1019990038309 | 6/1999 |
| KR | 100800647 | 2/2008 |

OTHER PUBLICATIONS

Notice of Preliminary Rejection issued from Korean Intellectual Property Office on Apr. 22, 2011.
Sungjin Whang et al., "Thermally Stable Ni-Silicide Gate Electrode with TiN Barrier Metal for NAND Flash Memory Application with 24 nm Technology and Beyond," 2009 SSDM.

* cited by examiner

*Primary Examiner* — David Vu
(74) *Attorney, Agent, or Firm* — IP & T Group LLP

(57) ABSTRACT

A semiconductor device including a conductive layer, a diffusion barrier layer formed over the conductive layer, including a refractory metal compound, and acquired after a surface treatment, and a metal silicide layer formed over the diffusion barrier layer. The adhesion between a diffusion barrier layer and a metal silicide layer may be improved by increasing the surface energy of the diffusion barrier layer through a surface treatment. Therefore, although the metal silicide layer is fused in a high-temperature process, it is possible to prevent a void from being caused at the interface between the diffusion barrier layer and the metal silicide layer. Moreover, it is possible to increase the adhesion between a conductive layer and the diffusion barrier layer by increasing the surface energy of the conductive layer through the surface treatment.

14 Claims, 6 Drawing Sheets

SEMICONDUCTOR DEVICE AND METHOD FOR FABRICATING THE SAME

CROSS-REFERENCES TO RELATED APPLICATIONS

The present application claims priority of Korean Patent Application Nos. 10-2009-0040395 and 10-2009-0059092, filed on May 8, 2009, and Jun. 30, 2009, respectively, which are incorporated herein by reference in their entirety.

BACKGROUND OF THE INVENTION

Exemplary embodiments of the present invention relate to a semiconductor device and a method for fabricating the same, and more particularly, to a semiconductor device with a gate pattern including a diffusion barrier layer and a metal silicide layer and a method for fabricating the semiconductor device.

Recent improvement in the integration degree of a semiconductor device has reduced the area of the semiconductor device. However, as the area is reduced, the resistance in a gate pattern and/or a word line increases, and therefore, the characteristics of the semiconductor device are deteriorated. This deterioration is a cause for concern. To address this concern, a method of reducing the resistance by forming a gate pattern and a word line of a metal silicide layer having a low resistance value has been considered.

Hereafter, a conventional method for forming a gate pattern and the concerns surrounding the method will be described.

FIG. 1A is a cross-sectional view illustrating a structure of a conventional gate pattern. As illustrated in the drawing, the gate pattern is formed by sequentially stacking a gate insulation layer 11, a conductive layer 12, a diffusion barrier layer 13, and a metal silicide layer 14 over a substrate 10. The gate pattern includes spacers 15 on its side walls and the gate regions between gate patterns are filled with an interlayer dielectric layer 16.

The gate insulation layer 11 is generally formed of an oxide layer, and the conductive layer 12 is generally formed of a polysilicon layer.

The metal silicide layer 14 reduces the resistance of a gate pattern or a word line, and it is generally formed of a nickel silicide (NiSi) layer formed from a reaction between a polysilicon layer and a nickel layer.

Herein, the metal silicide layer 14 is formed by sequentially forming a polysilicon layer and a metal layer over the diffusion barrier layer 13 and making the polysilicon layer react with the metal layer through a thermal treatment.

The diffusion barrier layer 13 is used to form the metal silicide layer 14 of a uniform thickness and prevent the metal included in the metal silicide layer 14 from being diffused into the conductive layer 12 under the diffusion barrier layer 13 during the formation of the metal silicide layer 14. Accordingly, the diffusion barrier layer 13 is interposed between the conductive layer 12 and the metal silicide layer 14.

Herein, the diffusion barrier layer 13 is generally formed to include a metal different from the metal included in the metal silicide layer 14. For example, when the metal silicide layer 14 is formed of a nickel silicide layer, the diffusion barrier layer 13 is formed by siliciding cobalt (Co) or titanium (Ti). In other words, the diffusion barrier layer 13 is formed of cobalt silicide ($CoSi_2$) or titanium silicide ($TiSi_2$).

However, there is concern that the diffusion barrier layer 13 is not sufficiently silicided due to a line width effect caused by the improvement in the integration degree of semiconductor devices. In particular, when the design rule is under approximately 40 nm, the diffusion barrier layer 13 including Co or Ti is scarcely silicided. Thus, the diffusion barrier layer 13 does not perform its function properly, and it may be contaminated with an impurity due to the Co or Ti during gate patterning.

Also, although the diffusion barrier layer 13 including Co or Ti is silicided, the Co or Ti characteristically requires a large amount of polysilicon during its silicidation process. In other words, a considerable amount of the polysilicon layer formed in the upper and lower portions of the diffusion barrier layer 13 is consumed and this affects the formation of the metal silicide layer 14 subsequently formed.

FIG. 1B shows a problem occurring in the course of performing a high-temperature process after the formation of a gate pattern according to the prior art. Herein, a metal silicide layer fused in the high-temperature process is marked with reference numeral '14A' and referred to as a fused metal silicide layer 14A.

As described above, the diffusion barrier layer 13 including Co or Ti may experience a change in phase or volume due to a reaction, such as silicidation during the high-temperature process. In this case, the metal included in the diffusion barrier layer 13 or the fused metal silicide layer 14A may be diffused into the conductive layer 12 under the diffusion barrier layer 13 (see reference symbol 'B'). In short, the diffusion barrier layer 13 does not properly perform its function.

Also, during the high-temperature process, a void (see reference symbol 'A') may be formed between the fused metal silicide layer 14A and the diffusion barrier layer 13.

For example, the fused metal silicide layer 14A formed of a nickel silicide layer has a melting point of approximately 950° C. At a temperature close to the melting point, the fused metal silicide layer 14A is liquefied. Herein, since the surface energy of the diffusion barrier layer 13 is low, the adhesion between the liquid-phase fused metal silicide layer 14A and the diffusion barrier layer 13 is decreased. Therefore, the fused metal silicide layer 14A is formed into a waterdrop shape and accordingly void A may be caused at the interface between the fused metal silicide layer 14A and the diffusion barrier layer 13. Herein, since the void A causes a vertical voltage drop, the performance of a semiconductor device is deteriorated due to an unbalanced vertical voltage.

The above-mentioned concerns may exist in all devices including a gate pattern using a metal silicide layer. In the present specification, the problems occurring when a gate pattern of a Dynamic Random Access Memory (DRAM) device is formed are described as an example. Although, the same problems may occur in the process of forming a gate electrode or a word line of a non-volatile memory device as well.

SUMMARY OF THE INVENTION

An embodiment of the present invention is directed to a semiconductor device which is appropriate for a high-temperature process by increasing adhesion between a diffusion barrier layer and a metal silicide layer, and a method for fabricating the semiconductor device.

In accordance with an embodiment of the present invention, an apparatus includes a semiconductor device, which includes a conductive layer, a diffusion barrier layer formed over the conductive layer, including a refractory metal compound, and acquired after a surface treatment, and a metal silicide layer formed over the diffusion barrier layer.

In accordance with another embodiment of the present invention, an apparatus includes a gate pattern of a semiconductor device, which includes a gate electrode, a diffusion barrier layer formed over the gate electrode, including a refractory metal compound, and acquired after a surface treatment, and a metal silicide layer formed over the diffusion barrier layer.

In accordance with yet another embodiment of the present invention, an apparatus includes a method for fabricating a semiconductor device, which includes forming a conductive layer, forming a diffusion barrier layer including a refractory metal compound over the conductive layer, performing a surface treatment onto the diffusion barrier layer, and forming a metal silicide layer over the diffusion barrier layer.

DESCRIPTION OF SPECIFIC EMBODIMENTS

Figure 1A:
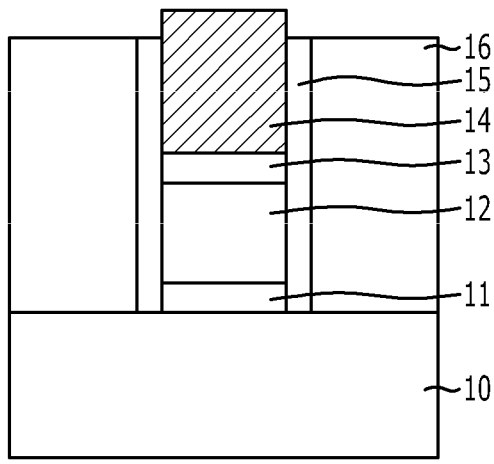
FIGS. 1A and 1B are cross-sectional views illustrating a structure of a conventional gate pattern.
Figure 1B:
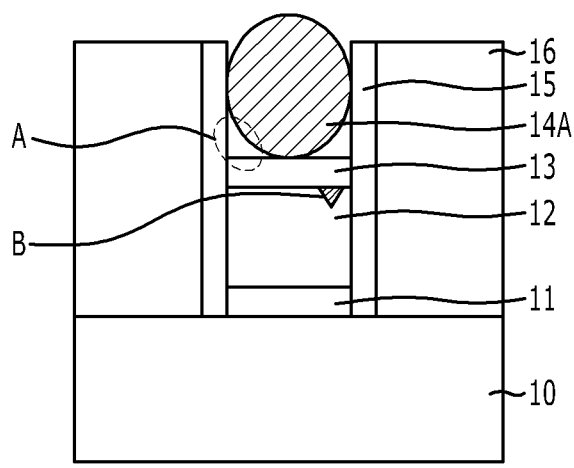

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2A:
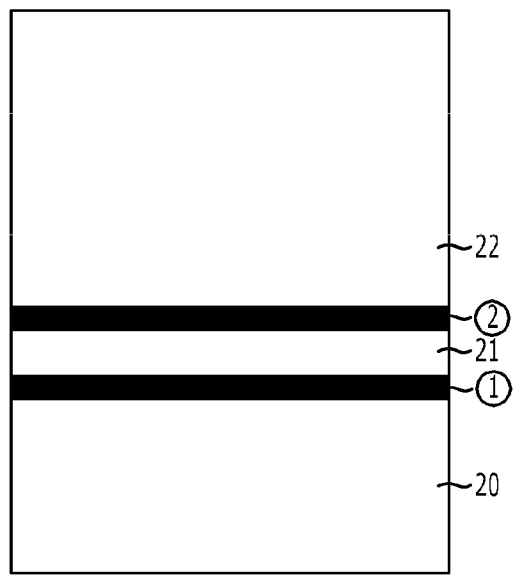
FIGS. 2A and 2B illustrate a structure of a gate pattern in accordance with an embodiment of the present invention.

FIG. 2A illustrates a structure of a gate stack in accordance with an embodiment of the present invention. As shown in the drawing, the gate stack includes a conductive layer 20, a diffusion barrier layer 21, and a metal silicide layer 22 sequentially stacked therein. Herein, the interface between the conductive layer 20 and the diffusion barrier layer 21 is marked as region 1, and the interface between the diffusion barrier layer 21 and the metal silicide layer 22 is marked as region 2.

The interfaces, marked by regions 1 and 2, are illustrated in the form of a sort of layer in the drawing for the purpose of illustrating a surface treatment performed onto the conductive layer 20 and the diffusion barrier layer 21. However, each of the regions 1 and 2 represents a region where ions are implanted in a predetermined depth from the surface or a region treated with plasma.

The conductive layer 20 may be a gate electrode or a word line of a Dynamic Random Access Memory (DRAM) device according to one embodiment of the present invention, or the conductive layer 20 may be a control gate electrode or a word line of a non-volatile memory device, and it may be formed of a polysilicon layer.

The diffusion barrier layer 21 is formed to form the metal silicide layer 22 in a uniform thickness and to prevent the metal included in the metal silicide layer 22 from being diffused into the conductive layer 20 under the diffusion barrier layer 21. The diffusion barrier layer 21 is interposed between the conductive layer 20 and the metal silicide layer 22.

Herein, the diffusion barrier layer 21 is formed over the conductive layer 20, and it includes a refractory metal compound. In particular, the diffusion barrier layer 21 may include a nitrogen-containing metal layer. Also, the diffusion barrier layer 21 may have an increased surface energy through a surface treatment.

The metal silicide layer 22 is formed to reduce the resistance of a gate pattern or a word line, and it is formed over the diffusion barrier layer 21.

According to the embodiment of the present invention described above, the diffusion barrier layer 21 includes a refractory metal compound. In particular, the diffusion barrier layer 21 includes a nitrogen-containing metal layer. Because the refractory metal compound has characteristics that make it thermally stable, and because it does not become involved in a reaction such as silicidation, it can properly perform its function as a diffusion barrier layer. Moreover, the refractory metal compound does not consume the polysilicon layer in the upper or lower portion of the diffusion barrier layer 21, and it may be kept away from being contaminated with metal during a gate patterning process.

Also, since a surface treatment is performed onto the diffusion barrier layer 21, the diffusion barrier layer 21 may have an increased surface energy. Therefore, the adhesion at the interface of region 2 between the diffusion barrier layer 21 and the metal silicide layer 22 may be improved. Also, since the Schottky barrier height at the interface of region 2, between the diffusion barrier layer 21 and the metal silicide layer 22, may be reduced and an ohmic contact may be achieved, a vertical voltage drop may be suppressed. In short, the electrical characteristics of a semiconductor device may be improved.

Herein, the surface treatment may be performed onto not only the diffusion barrier layer 21, but also onto the conductive layer 20 as well. When the surface treatment is performed onto the conductive layer 20, as mentioned earlier, the surface energy of the conductive layer 20 is increased and the adhesion at the interface of region 1, between the conductive layer 20 and the diffusion barrier layer 21, may be improved. Also, the Schottky barrier height at the interface of region 1, between the conductive layer 20 and the diffusion barrier layer 21, may be reduced and a vertical voltage drop may be suppressed by forming an ohmic contact. Therefore, the electrical characteristics of a memory device may be improved.

Figure 2B:
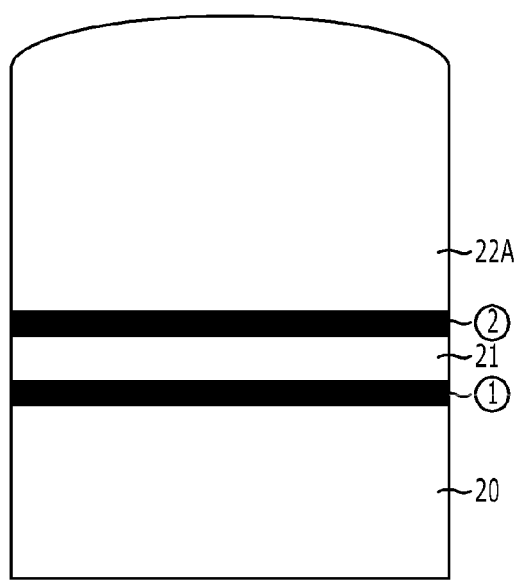

FIG. 2B illustrates a gate stack after a high-temperature process in accordance with one embodiment of the present invention. Herein, the metal silicide layer fused in the high-temperature process is marked with a reference numeral '22A' and referred to as a fused metal silicide layer 22A.

As described earlier, since the diffusion barrier layer 21 includes a refractory metal compound, particularly a nitrogen-containing metal layer, the phase or volume of the diffusion barrier layer 21 is not changed even in a high-temperature process. Thus, it is possible to prevent the metal included in the diffusion barrier layer 21 or the fused metal silicide layer 22A from being diffused into the conductive layer 20 during the high-temperature process, and in particular, it is possible to prevent nickel from being diffused into the conductive layer 20. In short, the diffusion barrier layer 21 can properly perform its function stably even in a high-temperature process.

In addition, since the adhesion between the diffusion barrier layer 21 and the fused metal silicide layer 22A is improved through a surface treatment, the interface of region 2, between the diffusion barrier layer 21 and the fused metal silicide layer 22A, maintains the contact state although the fused metal silicide layer 22A is in a liquid phase. In short, it is possible to prevent a void from being formed at the interface of region 2, between the diffusion barrier layer 21 and the fused metal silicide layer 22A, and accordingly, a vertical voltage may be uniformly maintained.

FIGS. 3A to 3F are cross-sectional views illustrating a method for forming a gate pattern by forming a gate stack and patterning the gate stack in accordance with an embodiment of the present invention.

In this embodiment of the present invention, a case where a surface treatment is performed onto a conductive layer and a diffusion barrier layer is described. However, as mentioned earlier, the technology of this embodiment may be applied to performing the surface treatment onto the diffusion barrier layer alone as well.

Figure 3A:
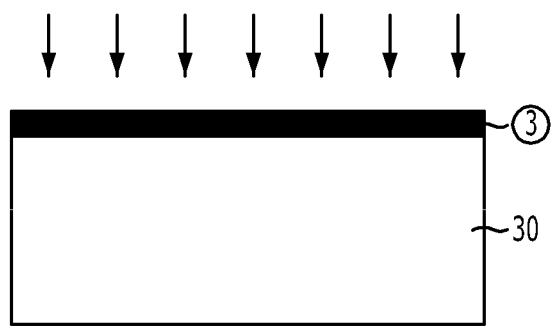
FIGS. 3A to 3F are cross-sectional views illustrating a method for forming a gate pattern in accordance with an embodiment of the present invention.

Referring to FIG. 3A, after a first conductive layer 30 is formed, a surface treatment is performed onto the first conductive layer 30. The arrow marks in the drawing represent the surface treatment. A region where ions are implanted in a predetermined depth from the surface or a region treated with plasma through the surface treatment is marked as region 3 in the drawing.

The surface treatment of the first conductive layer 30 may be performed through an ion implantation process or a plasma treatment. In particular, the surface treatment of the first conductive layer 30 may be performed using a surfactant, such as sulfur (S) or selenium (Se). For example, when the first conductive layer 30 is formed of a polysilicon layer, the Schottky barrier height may be decreased by performing an ion implantation process and passivating a dangling bond of silicon on the surface of the first conductive layer 30. Through this process, an ohmic contact is achieved between the first conductive layer 30 and a diffusion barrier layer, which will be formed in a subsequent process, to thereby suppress a vertical voltage drop.

Figure 3B:
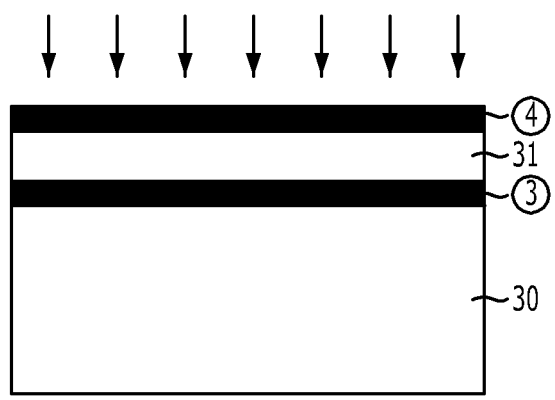

Referring to FIG. 3B, after a diffusion barrier layer 31, including a refractory metal compound, is formed over the first conductive layer 30, a surface treatment is performed onto the diffusion barrier layer 31. The arrow marks in the drawing represent the surface treatment. A region where ions are implanted in a predetermined depth from the surface or a region treated with plasma through the surface treatment is marked as region 4 in the drawing.

Herein, the diffusion barrier layer 31 may include a refractory metal compound, such as titanium (Ti) or tantalum (Ta), and it may be a nitrogen-containing metal layer. For example, the diffusion barrier layer 31 may include a titanium nitride (TiN) or a tantalum nitride (TaN). Also, the diffusion barrier layer 31 may be formed in a thickness ranging from approximately 150 Å to approximately 250 Å and it may be formed through a Physical Vapor Deposition (PVD) process.

The surface treatment of the diffusion barrier layer 31 may be performed through a low energy implantation or a plasma treatment. For example, it may be performed using an inert gas, particularly, argon (Ar) or nitrogen ($N_2$) gas. When the surface treatment is performed using the inert gas, the surface of the diffusion barrier layer 31 may be changed physically without any chemical reaction. Through this process, the surface energy may be improved to thereby increase adhesion.

Also, the surface treatment may be performed using a heavy weight element. When the surface treatment is performed using a heavy weight element, the surface of the diffusion barrier layer 31 may be physically changed easily.

Figure 3C:
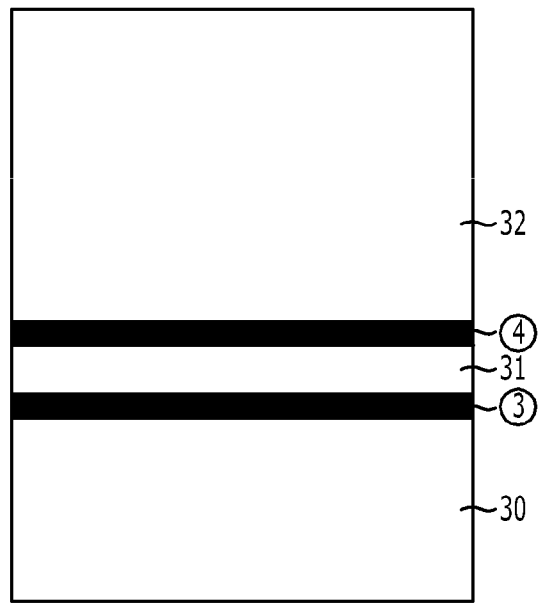

Referring to FIG. 3C, a second conductive layer 32 is formed over the diffusion barrier layer 31. Herein, the second conductive layer 32 may be formed of a polysilicon layer. As a result, a gate stack, including the first conductive layer 30, the diffusion barrier layer 31, and the second conductive layer 32 sequentially stacked thereon, is formed.

Figure 3D:
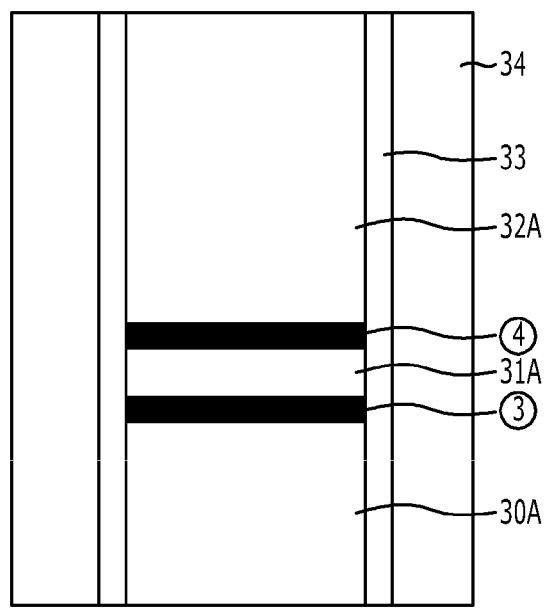

Referring to FIG. 3D, the gate stack, including the second conductive layer 32, the diffusion barrier layer 31, and the first conductive layer 30, is sequentially etched to thereby form a gate pattern including a first conductive layer pattern 30A, a diffusion barrier layer pattern 31A, and a second conductive layer pattern 32A.

Subsequently, spacers 33 are formed on the side walls of the gate pattern, and the gap region between gate patterns is filled with an interlayer dielectric layer 34, which is formed over the resultant structure with the spacers 33.

Figure 3E:
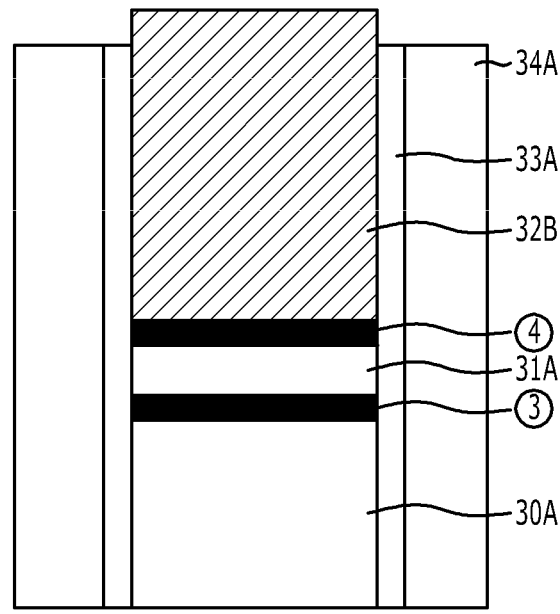

Referring to FIG. 3E, the interlayer dielectric layer 34 and the spacers 33 are etched back to a predetermined depth from the surface of the upper portion of the gate pattern to thereby expose a portion of the second conductive layer pattern 32A. Herein, the spacers 33 which are etched back are marked with reference numeral '33A' and referred to as etched spacers 33A, while the interlayer dielectric layer 34 which is etched back is marked with reference numeral '34A' and referred to as an etched interlayer dielectric layer 34A.

Subsequently, a metal layer is formed over the resultant structure. Herein, the metal layer may be formed of nickel (Ni).

Then, a metal silicide layer 32B is formed by making the second conductive layer pattern 32A react with the metal layer through a thermal treatment. Herein, the metal silicide layer 32B may become a fully silicided (FUSI) structure through a sufficient reaction. For example, the metal silicide layer 32B may be a nickel silicide (NiSi) layer. Herein, the metal silicide layer 32B is formed in a uniform thickness due to the diffusion barrier layer pattern 31A disposed in the lower portion of the second conductive layer pattern 32A, and metal components may be prevented from diffusing into the first conductive layer pattern 30A.

Subsequently, the metal layer remaining unreacted during the thermal treatment is removed.

As a result, a gate pattern including the first conductive layer pattern 30A, the diffusion barrier layer pattern 31A, and the metal silicide layer 32B is formed. Herein, the interface of region 3, between the first conductive layer pattern 30A and the diffusion barrier layer pattern 31A, and the interface of region 4, between the diffusion barrier layer pattern 31A and the metal silicide layer 32B, come to have an increased surface energy through the surface treatment, as described before. Therefore, the gate pattern is formed to have an increased adhesion at the interfaces of regions 3 and 4. Also, since the Schottky barrier height is decreased and the ohmic contact is achieved, it is possible to suppress a vertical voltage drop.

Figure 3F:
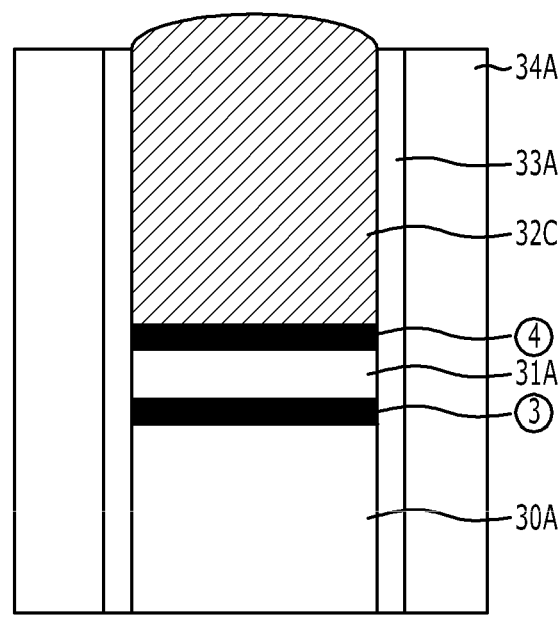

FIG. 3F illustrates the gate pattern acquired after performing a high-temperature process. Herein, the metal silicide layer fused in the high-temperature process is marked with reference numeral '32C' and referred to as a fused metal silicide layer 32C.

As described before, since the surface energy of the diffusion barrier layer pattern 31A is increased due to the surface treatment, the fused metal silicide layer 32C maintains full contact with the surface of the diffusion barrier layer pattern 31A. In other words, since the fused metal silicide layer 32C maintains its state of contact with the diffusion barrier layer pattern 31A at the interface of region 4, an effect such as Damascene technique is caused, and thus, a void is not formed.

Although this embodiment of the present invention is described with regards to a process of forming a gate pattern including a conductive layer, a diffusion barrier layer, and a metal silicide layer, the technology of the present invention is not limited to such a process, but rather, may be applied to all devices including a metal silicide layer, such as a DRAM device and a non-volatile memory device.

Figure 4:
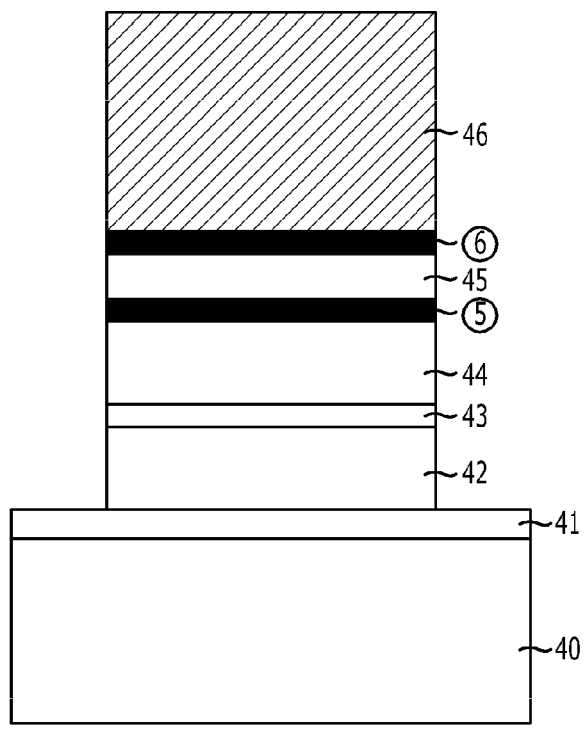
FIG. 4 is a cross-sectional view illustrating a structure of a gate pattern of a non-volatile memory device in accordance with an embodiment of the present invention.

FIG. 4 is a cross-sectional view illustrating a structure of a gate pattern of a non-volatile memory device in accordance with an embodiment of the present invention. As illustrated in the drawing, the non-volatile memory device includes a gate pattern having a tunnel insulation layer 41, a charge trapping layer or charge storage layer 42, a charge blocking layer 43, a gate electrode 44, a diffusion barrier layer 45, and a metal silicide layer 46 formed over a substrate 40.

Herein, the charge trapping layer or charge storage layer 42 is a data storage, which charges are injected to or discharged from. The charge storage layer 42 store charges within a conductive band and the charge trapping layer 42 trap charges in a deep potential trap site. Further, the charge storage layer may be formed of a polysilicon layer and the charge trapping layer may be formed of a nitride layer. For example, in the case of a floating gate-type non-volatile memory device including the charge storage layer 42 formed of a polysilicon layer, the floating gate-type non-volatile memory device includes a control gate electrode having the gate electrode 44, the diffusion barrier layer 45, and the metal silicide layer 46.

Herein, the adhesion at the interface of region 5, between the gate electrode 44 and the diffusion barrier layer 45, and the adhesion at the interface of region 6, between the diffusion barrier layer 45 and the metal silicide layer 46, may be increased by performing a surface treatment onto the gate electrode 44 and the diffusion barrier layer 45, respectively, to thereby increase the surface energy.

Since the process of forming a gate pattern by performing a surface treatment onto the gate electrode 44 and the diffusion barrier layer 45 is the same as described before, detailed description on it will be omitted in the description of the present embodiment. Also, the process of forming the tunnel insulation layer 41, the charge trapping layer or charge storage layer 42, the charge blocking layer 43, and the gate electrode 44 of a non-volatile memory device is obvious to those skilled in the art to which the present invention pertains, so a detailed description of the process will not be provided herein.

Figure 5:
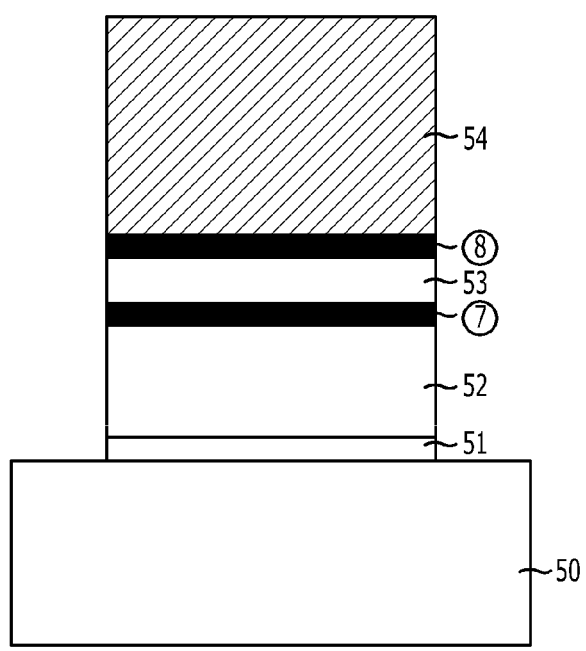
FIG. 5 is a cross-sectional view illustrating a structure of a gate pattern of a Dynamic Random Access Memory (DRAM) device in accordance with an embodiment of the present invention.

FIG. 5 is a cross-sectional view illustrating a structure of a gate pattern of a DRAM device in accordance with an embodiment of the present invention. As illustrated in the drawing, the DRAM device includes a gate pattern having a gate insulation layer 51, a gate electrode 52, a diffusion barrier layer 53, and a metal silicide layer 54 over a substrate 50.

The adhesion at the interface of region 7, between the gate electrode 52 and the diffusion barrier layer 53, and the adhesion at the interface of region 8, between the diffusion barrier layer 53 and the metal silicide layer 54, may be increased by performing a surface treatment onto the gate electrode 52 and the diffusion barrier layer 53, respectively, to thereby increase the surface energy.

Since the process of forming a gate pattern by performing a surface treatment onto the gate electrode 52 and the diffusion barrier layer 53 is the same as described before, detailed description on it will be omitted in the description of the present embodiment. Also, the process of forming the gate insulation layer 51 and the gate electrode 52 of a DRAM device is obvious to those skilled in the art to which the present invention pertains, so a detailed description of the process will not be provided herein.

According to one embodiment of the present invention, the adhesion between a diffusion barrier layer and a metal silicide layer may be improved by increasing the surface energy of the diffusion barrier layer through a surface treatment. Therefore, although the metal silicide layer is fused in a high-temperature process, it is possible to prevent a void from being caused at the interface between the diffusion barrier layer and the metal silicide layer. Moreover, it is possible to increase the adhesion between a conductive layer and the diffusion barrier layer by increasing the surface energy of the conductive layer through the surface treatment.

In addition, it is possible to form the metal silicide layer in a uniform thickness, and to prevent the phase or volume of the diffusion barrier layer from changing, due to the high-temperature process, by forming the diffusion barrier layer of a thermally stable refractory metal compound. Therefore, it is possible to prevent metal from being diffused even in a high-temperature process.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a conductive layer;
a diffusion barrier layer, including a refractory metal compound, formed over the conductive layer, the diffusion barrier layer including a surface region and a non-surface region, wherein the surface region and the non-surface region are chemically identical but have different physical structures; and
a metal silicide layer formed over the diffusion barrier layer, wherein the surface region of the diffusion barrier layer is in direct contact with the metal silicide layer.

2. The semiconductor device of claim 1, wherein the physical structure of the surface region of the diffusion barrier layer causes the surface region of the diffusion layer to have a greater surface energy than a surface energy of the non-surface region of the diffusion barrier layer.

3. The semiconductor device of claim 1, wherein the conductive layer includes a surface region, which is in direct contact with the diffusion barrier layer, and a non-surface region, and wherein the surface region of the conductive layer and the non-surface region of the conductive layer are chemically identical but have different physical structures.

4. The semiconductor device of claim 3, wherein the physical structure of the surface region of the conductive layer causes the surface region of the conductive layer to have a greater surface energy than a surface energy of the non-surface region of the conductive layer.

5. The semiconductor device of claim 1, wherein an interface region, formed between the diffusion barrier layer and the metal silicide layer, forms an ohmic contact between the diffusion barrier layer and the metal silicide layer due to a surface energy of the surface region of the diffusion barrier layer.

6. The semiconductor device of claim 1, wherein the diffusion barrier layer includes a metal layer containing nitrogen.

7. A gate pattern of a semiconductor device, the gate pattern comprising:
- a gate electrode;
- a diffusion barrier layer, including a refractory metal compound, formed over the gate electrode, the diffusion barrier layer including a surface region and a non-surface region, wherein the surface region and the non-surface region are chemically identical but have different physical structures; and
- a metal silicide layer formed over the diffusion barrier layer, wherein the surface region of the diffusion barrier layer is in direct contact with the metal silicide layer.

8. The gate pattern of claim 7, wherein the physical structure of the surface region of the diffusion barrier layer causes the surface region of the diffusion layer to have a greater surface energy than a surface energy of the non-surface region of the diffusion barrier layer.

9. The gate pattern of claim 8, wherein the gate electrode includes a surface region, which is in direct contact with the diffusion barrier layer, and a non-surface region, and wherein the surface region of the gate electrode and the non-surface region of the gate electrode are chemically identical but have different physical structures.

10. The gate pattern of claim 7, wherein the physical structure of the surface region of the gate electrode causes the surface region of the gate electrode to have a greater surface energy than a surface energy of the non-surface region of the gate electrode.

11. The gate pattern of claim 7, wherein an interface region, formed between the diffusion barrier layer and the metal silicide layer, forms an ohmic contact between the diffusion barrier layer and the metal silicide layer due to a surface energy of the surface region of the diffusion barrier layer.

12. The gate pattern of claim 7, wherein the diffusion barrier layer includes a metal layer containing nitrogen.

13. The gate pattern of claim 7, further comprising:
- a gate insulation layer interposed between a substrate and the gate electrode.

14. The gate pattern of claim 7, further comprising:
- a tunnel insulation layer formed over a substrate;
- a charge trapping layer or a charge storage layer formed over the tunnel insulation layer; and
- a charge blocking layer formed between the charge trapping layer or the charge storage layer and the gate electrode.

* * * * *